United States Patent
Steckel et al.

(10) Patent No.: US 12,293,729 B2
(45) Date of Patent: May 6, 2025

(54) OPTOELECTRONIC DEVICE

(71) Applicants: STMicroelectronics (Grenoble 2) SAS, Grenoble (FR); STMicroelectronics S.r.l., Agrate Brianza (IT)

(72) Inventors: Jonathan Steckel, Corenc (FR); Giovanni Conti, Acireale (IT); Gaetano L'Episcopo, Catania (IT); Mario Antonio Aleo, Catania (IT); Carmelo Occhipinti, Paterno (IT)

(73) Assignees: STMicroelectronics (Grenoble 2) SAS, Grenoble (FR); STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 18/527,968

(22) Filed: Dec. 4, 2023

(65) Prior Publication Data

US 2024/0105129 A1    Mar. 28, 2024

Related U.S. Application Data

(63) Continuation-in-part of application No. 18/209,605, filed on Jun. 14, 2023.

(30) Foreign Application Priority Data

Jun. 17, 2022    (EP) ..................... 22305890

(51) Int. Cl.
*G09G 3/34* (2006.01)
*H01L 25/16* (2023.01)

(52) U.S. Cl.
CPC ......... *G09G 3/3406* (2013.01); *H01L 25/167* (2013.01); *G09G 2320/02* (2013.01); *G09G 2320/0626* (2013.01); *G09G 2320/0693* (2013.01); *G09G 2360/148* (2013.01)

(58) Field of Classification Search
CPC .............................................. G09G 3/34–3696
See application file for complete search history.

(56) References Cited

U.S. PATENT DOCUMENTS

| | | | |
|---|---|---|---|
| 9,530,381 B1* | 12/2016 | Bozarth | H05B 47/00 |
| 2006/0066266 A1 | 3/2006 | Li Lim et al. | |
| 2008/0112164 A1 | 5/2008 | Teshirogi | |
| 2012/0293985 A1 | 11/2012 | Nozawa | |
| 2013/0015770 A1* | 1/2013 | Aitken | G09G 3/3406 315/186 |
| 2015/0221259 A1* | 8/2015 | Soto | G09G 3/3406 315/153 |
| 2015/0359067 A1 | 12/2015 | Kurita et al. | |
| 2017/0303365 A1* | 10/2017 | Chen | H05B 45/20 |
| 2019/0204679 A1* | 7/2019 | Koma | G02F 1/1335 |
| 2022/0115137 A1* | 4/2022 | Goldstein | G16H 10/60 |

OTHER PUBLICATIONS

EPO Search Report and Written Opinion for priority application, EP Appl. No. 22305890.0, report dated Dec. 19, 2022, 17 pgs.

* cited by examiner

*Primary Examiner* — Hang Lin
(74) *Attorney, Agent, or Firm* — Crowe & Dunlevy LLC

(57) ABSTRACT

An optoelectronic device includes a backlight panel illuminating a display panel. The backlight panel includes an array of light emitting pixels, each light emitting pixel having at least one subpixel with one or more light emitting diodes positioned on a substrate. The pixel further includes at least one photodetector positioned on the substrate and arranged to detect an amount of reflected light emitted by said subpixel and reflected by the display panel.

5 Claims, 15 Drawing Sheets

OPTOELECTRONIC DEVICE

PRIORITY CLAIM

This application is a Continuation-in-Part of U.S. patent application Ser. No. 18/209,605, filed Jun. 14, 2023, which claims the priority benefit of European Application for Patent No. 22305890.0, filed on Jun. 17, 2022, the contents of which are hereby incorporated by reference in their entireties to the maximum extent allowable by law.

TECHNICAL FIELD

The present disclosure relates generally to optoelectronic devices and related methods.

BACKGROUND

Non-emissive displays, and especially liquid crystal displays (LCD), are currently being made with backlight units (BLUs) that are two-dimensional and locally dimmed, which provides high contrast and high dynamic range (HDR). BLUs currently use blue light emitting diodes (LEDs) to create thousands of dimmable zones that can be dimmed to match the image being shown on the LCD display to provide the best HDR experience for the viewer.

The luminance of the LEDs is affected by LED fabrication tolerances, aging and operating temperature. This can result, during the operative lifetime of the display, in a mismatch between the emission of light among the LEDs of a display panel at a given polarization current, and/or a shift in the color balance over the BLU surface over time.

External light from the outside of the display may also affect the perception of the displayed pictures by projecting or reflecting objects shapes and shadows on the display.

There is a need in the art for an optoelectronic device and method of operating an optoelectronic device that at least partially provides one or more of the following: a uniform light emission of each zone or MD-Pixel across the whole display; a faster and cheaper BLU calibration in the factory; an active white color balance of the BLU over time; an active color brightness adjustment against ambient temperature effects; and an active color brightness adjustment as LED or color conversion materials covering the LEDs age over time.

There is a need in the to address all or some of the drawbacks of known optoelectronic device.

SUMMARY

First Aspect

One embodiment provides an optoelectronic device comprising a backlight panel illuminating a display panel, the backlight panel comprising an array of light emitting pixels, each light emitting pixel comprising: at least one subpixel comprising one or more light emitting diodes positioned on a substrate; and at least one photodetector positioned on the substrate and arranged to detect an amount of reflected light emitted by said subpixel and reflected by the display panel.

One embodiment provides a method of fabricating an array of light emitting pixels of a backlight panel for illuminating a display panel in an optoelectronic device, the method comprising fabricating each light emitting pixel of the array by: picking and placing at least one subpixel comprising one or more light emitting diodes on a substrate; and before or after picking and placing the at least one subpixel, picking and placing at least one photodetector on the substrate.

According to an embodiment, the backlight panel further comprises a control circuit coupled to said at least one subpixel and the corresponding photodetector, the control circuit being configured to control a level of light emission of said at least one subpixel as a function of an amount of reflected light detected by the at least one photodetector, wherein the control circuit is arranged, for example, to control the level of light emission of the subpixels by changing an amplitude and/or a pulse width of a respective driving signal.

One embodiment provides a calibration method of a backlight panel of an optoelectronic device, the method comprising: activating, by a control circuit of the backlight panel by applying a first driving signal, one or more light emitting diodes of a subpixel of a light emitting pixel of the backlight panel, each light emitting pixel comprising at least one of said subpixels, the backlight panel comprising an array of light emitting pixels for illuminating a display panel of the optoelectronic device; detecting, by a photodetector of the light emitting pixel, an amount of reflected light emitted by said subpixel and reflected by the display panel, said at least one subpixel and the corresponding photodetector being coupled to the control circuit; and generating by the control circuit based on the detected amount of reflected light, and storing in a memory of the control circuit, one or more first offset values indicating an offset level to be applied to the driving signal.

According to an embodiment, the first driving signal and the one or more first offset values correspond to a first calibration point, the method further comprising: activating, by the control circuit of the backlight panel by applying a second driving signal, the one or more light emitting diodes of the subpixel; detecting, by the photodetector, an amount of reflected light emitted by said subpixel and reflected by one or more element of the display panel; and generating by the control circuit based on the detected amount of reflected light, and storing in the memory of the control circuit, one or more second offset values indicating an offset level to be applied to the second driving signal, wherein the second driving signal and the one or more second offset values correspond to a second calibration point.

One embodiment provides a method of controlling a backlight panel of an optoelectronic device, the method comprising: activating, by a control circuit of the backlight panel, one or more light emitting diodes of a subpixel of a first light emitting pixel of the backlight panel by applying a first driving signal, each first light emitting pixel comprising at least one of said subpixels and at least one photodetector for detecting an amount of reflected light emitted by said subpixel, the backlight panel comprising an array of light emitting pixels for illuminating a display panel of the optoelectronic device, wherein the control circuit is configured to generate the first driving signal based on a first offset value corresponding to a first calibration point associated with said subpixel.

According to an embodiment, the method further comprises: activating, by the control circuit, said one or more light emitting diodes of said subpixel of said first light emitting pixel of the backlight panel by applying a second driving signal, wherein the control circuit is configured to generate the second driving signal based on a second offset value corresponding to a second calibration point, associated with said subpixel, and different from the first calibration point.

According to an embodiment, the method further comprises: detecting, by the photodetector of the first light emitting pixel, an amount of reflected light emitted by said at least one subpixel and reflected by the display panel, said at least one subpixel and the corresponding photodetector being coupled to the control circuit; and controlling, by the control circuit, a level of light emission of said at least one subpixel as a function of the detected amount of reflected light.

According to an embodiment, the method further comprises supplying by the control circuit the first driving signal to said at least one subpixels, the detected amount of reflected light being respectively compared with the respective calibration point, associated to said at least one subpixel, or with a tolerance range based on the respective calibration point, the control circuit being arranged to adjust the level of light emission of each of the said at least one subpixel as function of the respective comparison by supplying the second driving signal to said at least one subpixel.

According to an embodiment, the different calibration points relative to said at least one subpixel are stored in a look-up table, the look-up table comprising first and second driving signals and the respective targeted subpixels luminance as well as the photodetector output signal as function of its luminance input; the detected amount of reflected light being respectively compared with an extrapolation between two different calibration points.

According to an embodiment, the control circuit is arranged to: control the level of light emission of each of first subpixels of the light emitting pixels of the backlight panel so that the detected amount of reflected light of each of said first subpixels of all light emitting pixels of the backlight panel is equal or approximatively equal for all light emitting pixels of the backlight panel, and/or control the level of light emission of each of second subpixels of the light emitting pixels of the backlight panel so that the detected amount of reflected light of each of said second subpixels of all light emitting pixels of the backlight panel is equal or approximatively equal for all light emitting pixels of the backlight panel; and/or control the level of light emission of each of third subpixels of the light emitting pixels of the backlight panel so that the detected amount of reflected light of each of the third subpixels of all light emitting pixels of the backlight panel is equal or approximatively equal for all light emitting pixels of the backlight panel.

According to an embodiment, the control circuit is configured to control the respective level of light emission of said first, second and third subpixels to obtain a ratio between the detected amount of reflected light related to the first, second and third subpixels that leads to a white color at the light emitting pixels level.

According to an embodiment, the light emitting pixels of the backlight panel each comprise at least first, second and third subpixels and for example one or more further subpixels; wherein the one or more light emitting diodes of the first subpixels are configured to emit light of a first wavelength, the one or more light emitting diodes of the second subpixel are configured to emit light of a second wavelength different to the first wavelength, the one or more light emitting diodes of the third subpixel are configured to emit light of a third wavelength different to the first and second wavelength, and/or in the example that the light emitting pixels comprise the one or more further subpixels, the one or more light emitting diodes of each of the further subpixels are configured to emit light of a wavelength different to each other subpixel of the light emitting pixel; the first wavelength being equal to at least 250 nm and less than 450 nm, the second wavelength being equal to at least 450 nm and less than 525 nm and the third wavelength being equal to at least 525 nm and less than 700 nm; wherein the photodetector of each of the light emitting pixels comprises at least: one first photodiode and a first filter arranged to partially filter out and at least partially prevent the second wavelength light from reaching the first photodiode; one second photodiode and a second filter arranged to partially filter out and at least partially prevent the first wavelength light from reaching the second photodiode; and one third photodiode and a third filter arranged to partially filter out and at least partially prevent the first and second wavelengths light from reaching the third photodiode; the control circuit being configured to control the respective level of light emission of said first, second and third subpixels as a function of the respective amount of reflected light detected by the first, second and third photodiodes.

According to an embodiment, said one or more light emitting diodes are individually covered with a color conversion element configured to convert light emitted by said one or more light emitting diodes into light of a different wavelength from the wavelength of the light emitted by said one or more light emitting diodes.

According to an embodiment, the display panel comprises: portions comprising liquid crystals, each portion being arranged to cover at least one of the subpixels; and a display controller arranged to control said portions to let pass or to stop light emitted by said at least one of the subpixels.

Second Aspect

The following embodiments provide an optoelectronic device comprising: a backlight panel, illuminating a display panel and comprising an array of pixels, each pixel comprising: at least one subpixel comprising one or more diodes positioned on a substrate; said diodes being configured to, in a non-emitting mode, detect external light illuminating the display panel, and in an emitting mode, to emit light; and a computing unit configured to provide external light data based on an amount of light detected in the non-emitting mode and to adjust light emitted by the one or more diodes, in the emitting mode, based on said external light data.

Another example of the second aspect provides a method of driving an optoelectronic device comprising a backlight panel, illuminating a display panel and comprising an array of pixels, each pixel comprising: at least one subpixel comprising one or more diodes positioned on a substrate; said diodes being configured to, in an non-emitting mode, detect external light illuminating the display panel, and in an emitting mode, emit light; the method comprising: providing, using a computing unit, external light data based on an amount of light detected in the non-emitting mode and adjusting light emitted by the one or more diodes in the emitting mode based on said external light data.

According to an example, the optoelectronic device further comprises a control unit configured to provide driving signals configured to drive said one or more diodes.

According to an example, the control unit is configured to modify an amplitude and/or a pulse width of a respective driving signal based on said external light data.

According to an example, the pixels of the backlight panel each comprise at least first, second and third subpixels and for example one or more further subpixels; the one or more diodes of the first subpixels being configured to emit light of a first wavelength and detect wavelengths smaller than the first wavelength, the one or more diodes of the second subpixel are configured to emit light of a second wavelength, different to the first wavelength, and detect wavelengths smaller than the first wavelength, the one or more diodes of the third subpixel are configured to emit light of a third wavelength different to the first and second wavelength and detect wavelengths smaller than the third wavelength, and/or in the example that the pixels comprise the one or more further subpixels, the one or more diodes of each of the further subpixels are configured to emit light of a fourth wavelength different to each other subpixel of the pixels and detect wavelengths smaller than the fourth wavelength; the first wavelength being equal to at least 400 nm and less than 490 nm, the second wavelength being equal to at least 500 nm and less than 570 nm, the third wavelength being equal to at least 600 nm and less than 660 nm and the example fourth wavelength being equal to at least 800 nm and less than 900 nm; the computing unit being configured to provide respective external light data based on the amount of light detected in the non-emitting mode by each different diodes of the first, second, third and example fourth subpixels.

According to an example, in the non-emitting mode, the control unit is configured to drive the diodes of the subpixels with a null or inverse bias/current.

According to an example, in the emitting mode, the control unit is configured to drive the diodes of the subpixels with a forward bias/current.

According to an example, said one or more diodes are individually covered with a color conversion element configured to convert light emitted by said one or more diodes into light of a different wavelength from the wavelength of the light emitted by said one or more diodes.

According to an example, the display panel comprises: portions comprising liquid crystals, each portion being arranged to cover at least one of the subpixels; and a display controller arranged to control said portions to let pass or to stop light emitted by said at least one of the subpixels.

According to an example, the control unit is configured to drive, in the emitting mode, each of said one or more diodes of the first, second and third subpixels, and for example said fourth subpixels, with signals based on their respective computed external light data.

According to an example, the computing unit is comprised in the control unit.

According to an example, the control unit is configured to receive picture data and apply driving signals, to the diodes, based on their respective computed external light data and said picture data.

According to an example, the computing unit is comprised in a processor of the optoelectronic device.

According to an example: the processor is configured to modify picture data based on said computed external light data; and the control unit is configured to receive said modified picture data and apply driving signals, to the diodes, based on said modified picture data.

According to an example, the optoelectronic device comprises an analyzing unit configured to determine a human gesture from said external light data.

The described embodiments allow a reduction of the space occupancy of the external light sensing elements and of the related additional system architecture. The device complexity is also reduced and costs decreased.

The brightness and/or color adjustment is more accurate for improving the quality of the displayed image with respect to the perception by the human eye.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to an LCD display as orientated during normal use.

Unless specified otherwise, the expressions "around", "approximately", "substantially" and "in the order of" signify within 10%, and preferably within 5%.

First Aspect

Figure 1:
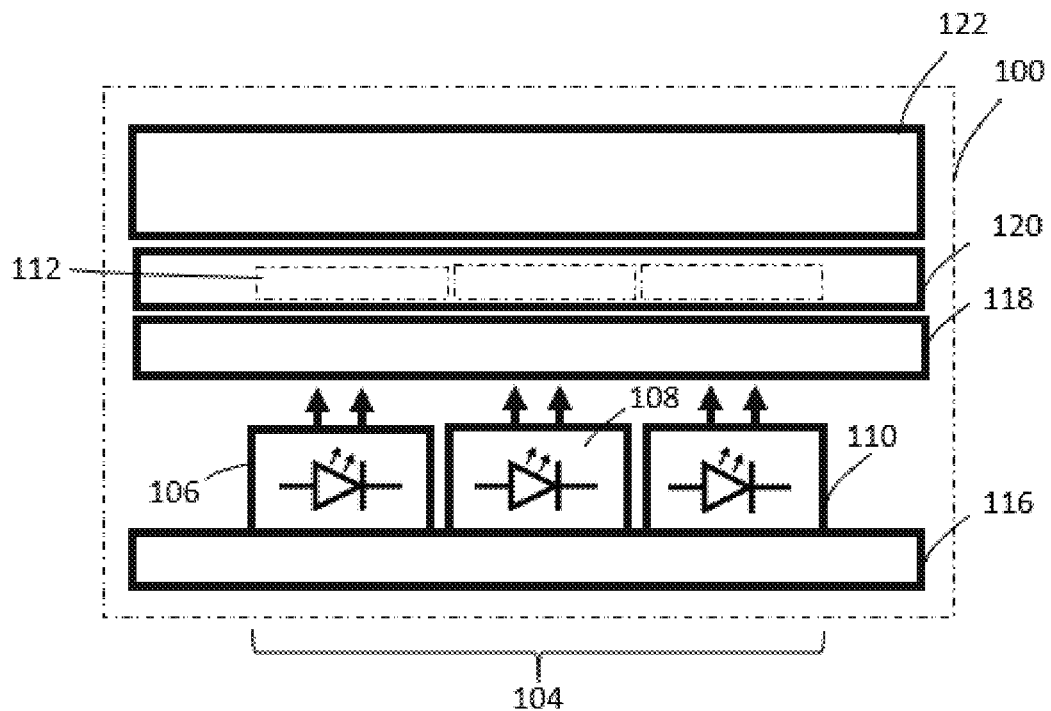
FIG. 1 is a schematic sectional view of an optoelectronic device.

FIG. 1 is a schematic sectional view of an optoelectronic device 100, for example an LCD display, according to an example.

The optoelectronic device 100 of FIG. 1 comprises a backlight panel 116 supporting light emitting pixels 104. For ease of illustration, FIG. 1 illustrates a single light emitting pixel 104 supported by the backlight panel 116, but in other embodiments, the optoelectronic device 100 comprises an array of hundreds or thousands of light emitting pixels supported by the backlight panel 116.

The light emitting pixel 104 comprises, for example, red, blue and green subpixels 106, 108, 110, for example each comprising one or more LEDs. In another example, the LEDs of the subpixels are all configured to emit blue or ultraviolet light. In another example, the light emitting diodes of one of the subpixels 106, 108, 110 is configured to emit light of a first wavelength, and the one or more light emitting diodes of another of subpixels of the same pixel 202 is configured to emit light of a second wavelength different to the first wavelength. In another example, S subpixels, each similar to the subpixels 106, 108, 110 are comprised in each light emitting pixel 104, where S is any integer equal to or greater than 1. In this example, the light emitting diodes of each of the S subpixels are configured to emit light of a different wavelength with respect to the other subpixel. Said Otherwise, the one or more light emitting diodes of one of the S subpixels is configured to emit light of a first wavelength, the one or more light emitting diodes of another of subpixels of the same pixel 202 is configured to emit light of a second wavelength different to the first wavelength, and the one or more light emitting diodes of Sth subpixel of the same pixel 202 is configured to emit light of an Sth wavelength different to the first and second wavelengths. The LEDs are controlled, for example, by an LED driver (not illustrated in FIG. 1), which supplies an electrical signal (e.g., current) to each LED, the light emitted by each LED for example being proportional to the current.

A color conversion portion 118 is arranged, for example, over the light emitting pixel 104, and is configured to adjust the color of the light emitted by the light emitting pixel 104. Diffusive layers, which are not illustrated, are also present, for example, within the color conversion portion 118, over the light emitting pixel 104. For an array of light emitting pixels 104, a corresponding color conversion portion 118 may be provided for each pixel, or may be shared by a group of neighboring pixels. Alternatively, in a non-illustrated example, a separate color conversion portion 118 may be arranged over each subpixel or each LED of the light emitting pixel 104. The portion 118 transforms light from the subpixel into, for example, white light if the respective luminance of the subpixels of the light emitting pixel 104 are balanced accordingly.

A layer 120 comprising liquid crystals is, for example, arranged over the color conversion portion 118. The liquid crystal layer 120 is, for example, divided into individual portions 112 that cover each respective subpixel 106, 108, 110 or LED of the light emitting pixel 104. The liquid crystal layer 120 is, for example, coupled to transistors, for example, thin film transistors. The liquid crystals and the associated transistors are controlled, for example, to selectively block or allow to pass light generated by the corresponding subpixel.

A display 122, comprising a display glass and/or color conversion layers, is arranged, for example, on the top of the liquid crystal layer 120. The display is made up of a matrix of pixels. Each pixel of the display is defined, for example, by the liquid crystal portion 112, which is illuminated by the backlight LEDs or subpixels 106, 108, 110. In an example, one light emitting pixel 104 may illuminate one or more pixels of the display 122.

A difficulty with the optoelectronic device 100 of FIG. 1 is that the luminance of the LEDs is affected by LED fabrication tolerances, aging and operating temperature. This can result, during the operative lifetime of the display, in a mismatch between the emission of light among the LEDs of a display panel at a given polarization current, and/or a shift in the color balance over time.

Figure 2:
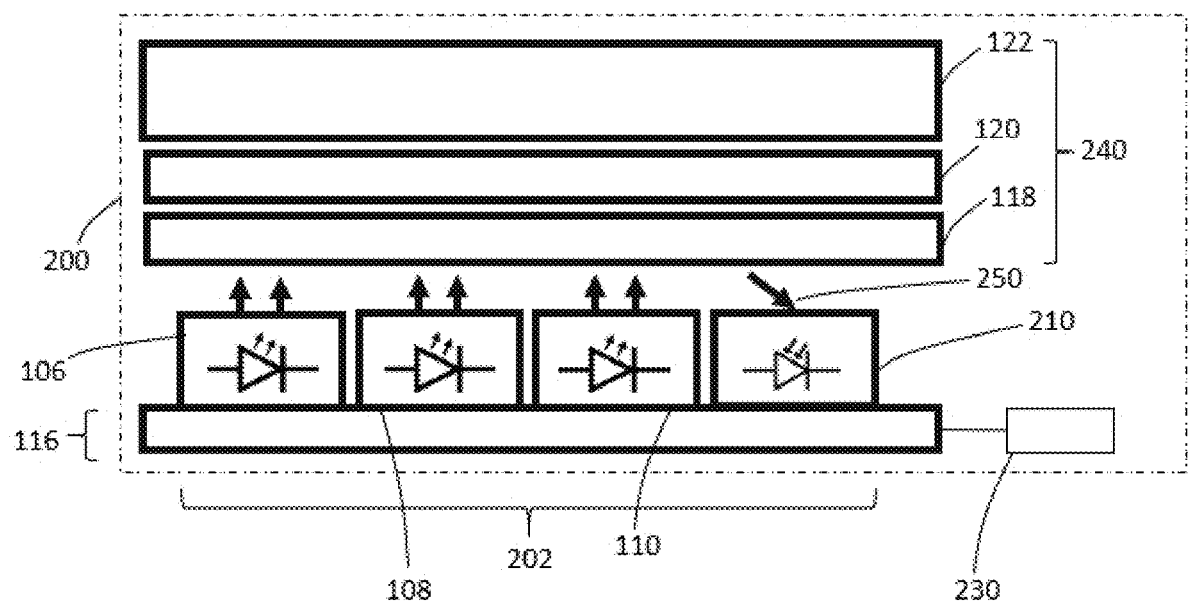
FIG. 2 is a schematic sectional view of an optoelectronic device.

FIG. 2 is a schematic sectional view of an optoelectronic device 200, which is for example an LCD display.

The optoelectronic device 200 is similar to the device of FIG. 1 except that the emitting pixel 202 comprises a photodetector (PD), which is coupled to the backlight panel 116. In an example, each light emitting pixel 202 comprises a PD in order to be able to capture at least a part of reflected light emitted by the light emitting diodes of each light emitting pixel 202 and reflected by a display panel 240, in particular by, for example, one or more elements of the display panel 240, such as color conversion layers, diffusion layers, etc. In another example, each light emitting pixel 202 comprises more than one PD, for example, one PD for each emitted color or one PD per subpixel 106, 108, 110. The display panel 240 is formed by the color conversion portion 118 and/or the liquid crystal layer 120 and/or the display 122. In some embodiments, as will become apparent from the following description, the presence of the photodetectors in the pixels permits the color conversion portion 118 to be omitted. Incoming light from the subpixels may be reflected either by one or all of the components 118, 120, 122 of the display panel 240 to reach the photodetector PD. The detected reflected light can be linked, for example using a look-up table, to the amount of emitted light for each of the subpixels 106, 108, 110.

In a non-illustrated example, a PD is surrounded on the backlight panel 116 by a plurality of light emitting pixels in order to be able to capture at least a part of reflected light 250 emitted by the different light emitting pixels and reflected by the display panel 240.

The backlight panel 116 of FIG. 2, for example, further comprises a control circuit 230 coupled to the LED driver (not illustrated in FIG. 2) and the photodetector PD. The control circuit 230 is configured to adjust, using the LED driver, a level of light emission of each of the subpixels 106, 108, 110 as a function of the detected amount of reflected light. It allows, for example, a dynamic color balance control of the display, for example when the electronic device is aging.

Figure 3:
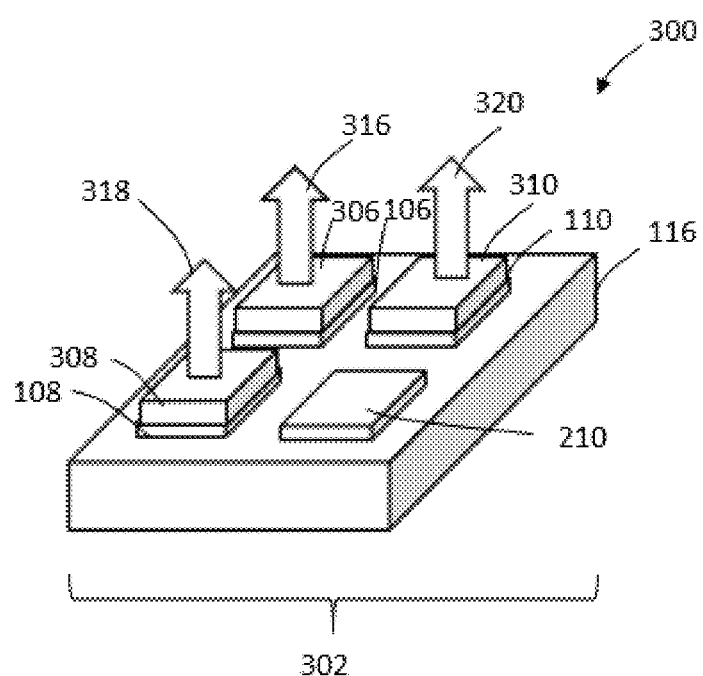
FIG. 3 is a perspective view of a light emitting pixel of a backlight panel of an electronic device.

FIG. 3 is a perspective view of a light emitting pixel 302 of the backlight panel 116 of an electronic device 300.

The light emitting pixel 302 is, for example, similar to the light emitting pixel 202 of the FIG. 2 except that the subpixels 106, 108 and 110 are each arranged at a corresponding corner of a virtual rectangle or square, and the photodetector 210 is arranged on the remaining corner of the virtual rectangle or square. In another example, the subpixels 106, 108 and 110 may be arranged in the light emitting pixel 202 according to any arrangement such as a virtual circle or a triangle or according to a non-geometrical arrangement, and the photodetector 210 is arranged in a manner that it can detect reflected light. In the example of FIG. 3, the LEDs forming the subpixels 106, 108 and 110 are covered respectively with an optional color conversion layer 306, 308, 310. The person skilled in the art will know how to adapt the color conversion layer composition for each of the subpixel depending on the incoming light wavelength of each LED and on the desired resulting emitted light 316, 318 and 320.

Figure 4:
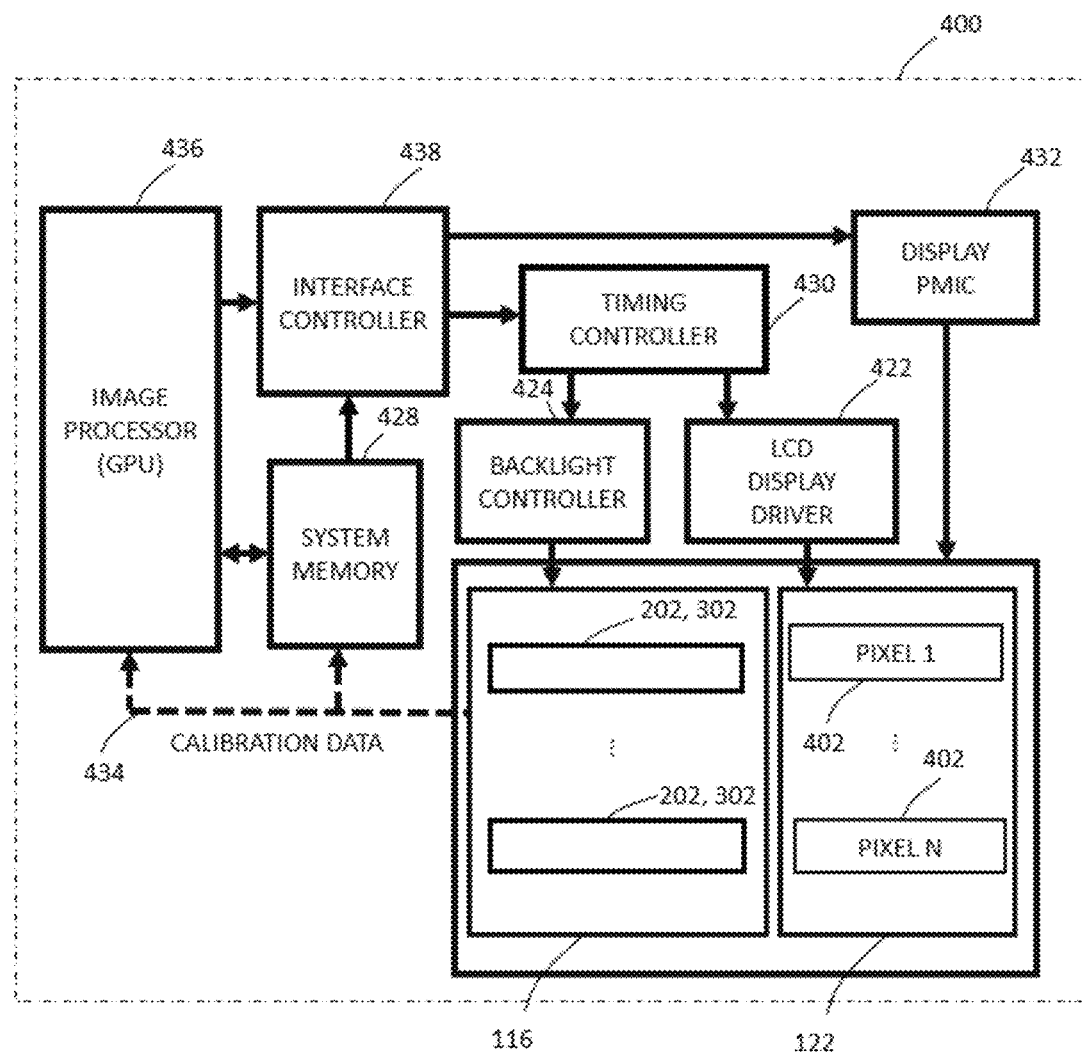
FIG. 4 schematically illustrates an architecture of an electronic device.

FIG. 4 schematically illustrates an architecture of an electronic device 400.

The electronic device 400 comprises, for example, the backlight panel 116 formed of an array of emitting pixels 202, 302, similar to those of FIG. 2 or FIG. 3. The light emitting pixels 202, 302 are controlled, for example, by the control circuit (BACKLIGHT CONTROLLER) 424. The display 122 comprises, for example, pixels 402 (PIXEL 1, PIXEL N), which are controlled, for example, by an LED display driver 422 (LCD DISPLAY DRIVER). The array of light-emitting pixels 202, 302 generates, for example, white light. The light-emitting pixels 202, 302 are synchronized, for example, with the pixels of the display 122 by a timing controller (TIMING CONTROLLER) 430. The electronic device 400 comprises, for example, a power management controller (DISPLAY PMIC) 432, which powers the display 122 and the backlight panel 116. The electronic device 400 comprises, for example, an image processing unit (IMAGE PROCESSOR (GPU)) 436 which controls, for example, an interface controller (INTERFACE CONTROLLER) 438 and which interacts with a system memory (SYSTEM MEMORY) 428. The interface controller 438 manages, for example, the timing controller 430 and the display power management 432 in order to synchronize images displayed by the display 122 and the corresponding backlight image formed by the chosen emitting pixels 202, 302. The interface controller 438 uses, for example, data from the system memory 428. The system memory 428 stores, for example, calibration data (CALIBRATION DATA) 434 related to the subpixels of the light emitting pixels 202, 302. The calibration data 434 is also used, for example, by the image processing unit 436 to equilibrate the relative light intensity of each subpixel of the emitting pixels 202, 302 in order, for example, to obtain a reference white color balance and/or a homogeneous backlight level.

Such an electronic device 400 allows a dynamic color balancing of the display 122 and/or a dynamic homogeneity of light across the surface of the display 122.

Figure 5:
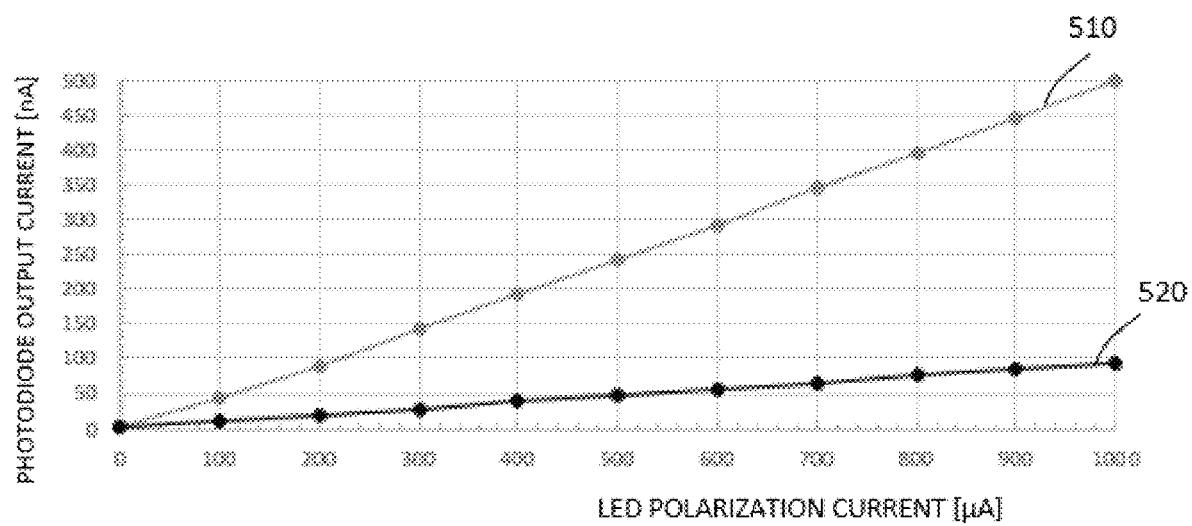
FIG. 5 is a graph of a photodiode output current as a function of an LED average polarization current.

FIG. 5 is a graph of the output current in nanoamps (PHOTODIODE OUTPUT CURRENT [nA]) of the photodiode 210 of an emitting pixel 202, 302 as a function of the polarization current in microamps (LED POLARIZATION CURRENT [µA]) of an LED of one subpixel. The curve 510 represents the case where the display panel 240 is covering the light emitting pixel, and the curve 520 represents the case where the display panel 240 is not covering the subpixel.

In the example of FIG. 5, the photodiode 210 is polarized, for example, with a negative voltage of −5 V, although it could more generally be polarized at between −1 and −5V or any other suitable polarization voltage. As the LED polarization current increases, the light emitted by the LED increases, and thus the photodiode 210 output current increases. As represented by the curve 510, the presence of the display panel 240 covering the pixel increases the amount of reflected light and therefore the photodiode detects more light, leading to a higher photodiode current when compared to the curve 510. Thus, it can be seen that the curve 510 has a steeper slope than the curve 520. For example, the current output of the photodiode is around five times higher with the presence of the display panel than without.

Figure 6:
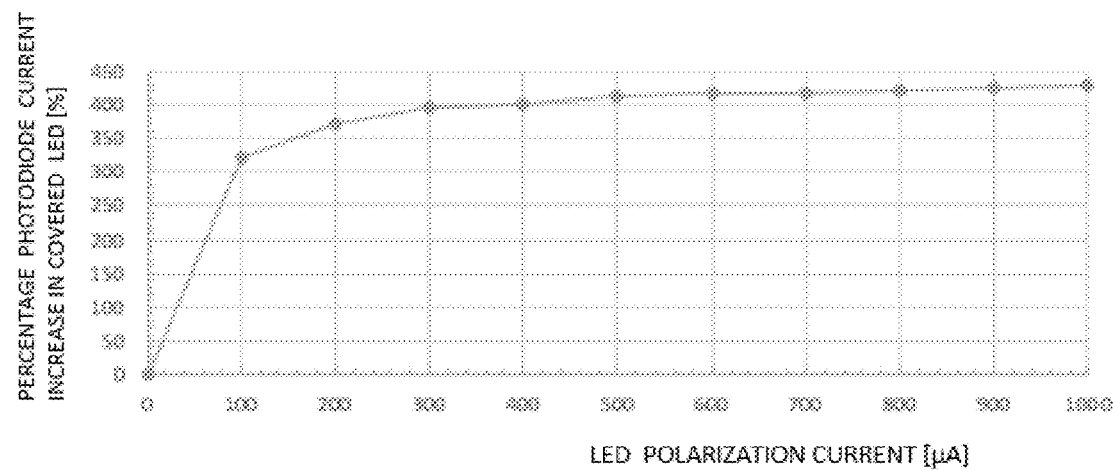
FIG. 6 is a graph of a percentage of the photodiode current increase as function of an LED average polarization current.

FIG. 6 is a graph of a percentage of the photodiode current increase of a LED covered by the display panel 240 (PERCENTAGE OF PHOTODIODE CURRENT INCREASE IN COVERED LED [%]) as function of the LED polarization current (LED POLARIZATION CURRENT [µA]) in microamps.

FIG. 6 shows, for example, that the percentage of current of the photodiode, when the display panel 240 is present, varies almost linearly when the LED polarization current is between 300 and 1000 µA.

Figure 7:
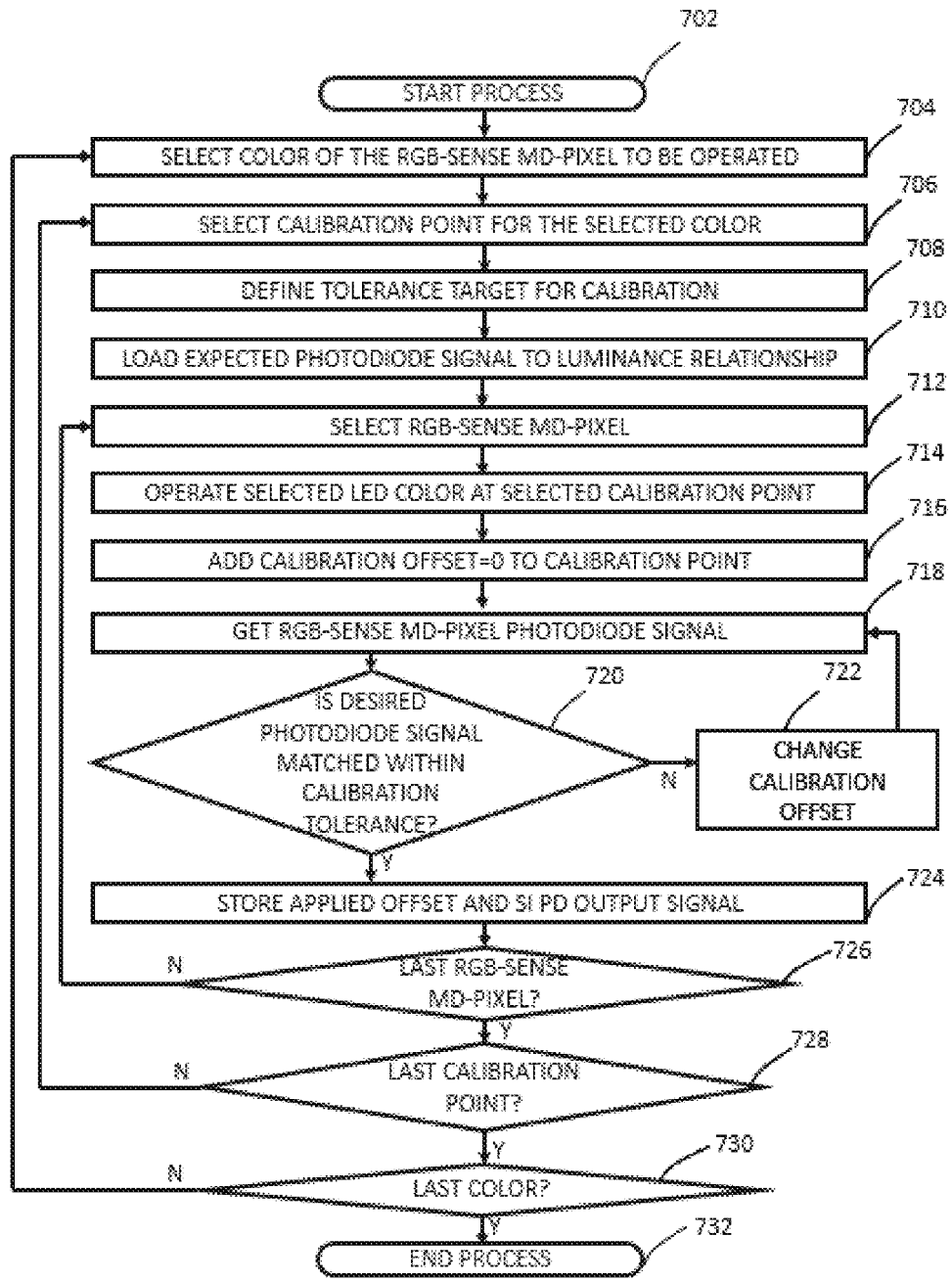
FIG. 7 is a flow diagram illustrating steps of a calibration method of the backlight panel of FIG. 2 or FIG. 4.

FIG. 7 is a flow diagram illustrating steps of a calibration method of the backlight panel 116 of FIG. 2 or FIG. 4.

Before implementing the method of FIG. 7, some parameters are determined, for example, at the factory stage. For example, a first parameter determined is the relation between average LED current and LED luminance for each subpixel in each light emitting pixel. Additionally, or alternatively, a second parameter determined is the relation between photodiode input luminance and photodiode output signal (e.g., current) for each subpixel color in each light emitting pixel. Additionally, or alternatively, a third parameter determined is the current accuracy range due to the LED Driver 422 for each subpixel in the light emitting pixels.

The method of FIG. 7 illustrates an example of a calibration process for calibrating the LED backlight panel to have uniform light emission for all pixels.

In a step 702 (START PROCESS) the calibration method starts.

In a step 704 (SELECT COLOR OF THE RGB-SENSE MD-PIXEL TO BE OPERATED), a color to be emitted by a subpixel is chosen. For example, in some embodiments, the sub-pixels of each pixel of the backlight panel 116 are configured to emit different colors of light, such as red, green and blue, and the calibration of the pixels is performed for each color in turn. Thus, step 704 involves selecting the first color to be calibrated. In alternative embodiments, all the sub-pixels of each pixel of the backlight panel are configured to emit a same color, such as blue, and in this case the step 704 can be omitted.

In a step 706 (SELECT CALIBRATION POINT FOR THE SELECTED COLOR), a calibration point associated with the chosen color is selected, for example from a look-up table. Each calibration point defines, for example, an average LED current setting for all pixels of the backlight panel corresponding to a given LED luminance. The average LED current setting is, for example, the setting applied to the LED driver 422. There are, for example, a plurality of different calibration points defined for the backlight panel 116 such that the luminance level can be varied across the backlight panel, as a function of the image data. For example, in some embodiments, eight or more calibration points are defined for each color. In an example, the LED current is modulated, for example, by pulse width modulation (PWM), and the average LED current setting defined by each calibration point is the PWM setting.

In the case that the sub-pixels of each pixel of the backlight panel 116 are configured to emit different colors of light, the calibration point selected in step 706 is a function of the color selected in step 704. If all of the subpixels are configured to emit a same color, the calibration point corresponds to this color.

In a step 708 (DEFINE TOLERANCE TARGET FOR CALIBRATION), a tolerance target is defined for the calibration point range. For example, the tolerance target is defined as a difference between a measured photodiode output current and a desired photodiode output current that will be considered to be acceptable. In some embodiments, this difference is defined as an absolute value, such as plus or minus M microamps, where M is the tolerance in microamps, or as a percentage of the target current, such as plus or minus P percent, where P is the tolerance as a percentage, and is selected, for example, to be between 1 and 10 percent. In some embodiments, the tolerance target for one LED color is different from the tolerance target for another LED color.

In a step 710 (LOAD EXPECTED PHOTODIODE SIGNAL TO LUMINANCE RELATIONSHIP) a function linking the photodiode signal to the luminance of the subpixel, which is stored, for example, in the system memory 428, is loaded for example to the INPUT processor 436. Furthermore, this function is used, for example, to calculate the target photodiode signal for the luminance associated with the current calibration point. In some embodiments, the same function linking the photodiode signal to the luminance is used for all pixels of the backlight panel. In other embodiments, each color is associated with a corresponding function, such that differences in the sensitivity of the photodiodes for different colors can be considered. Additionally, or alternatively, each sub-pixel is associated with a corresponding function, such that any pixel to pixel variations in the photodiode sensitivity can be considered.

In a step 712 (SELECT RGB-SENSE MD-PIXEL), a subpixel 106, 108, 110 of one of the light emitting pixels 202 is selected for calibration. Indeed, according to one embodiment, the calibration of each pixel of the backlight panel 116 is performed one at a time. In alternative embodiments, it would be possible to calibrate more than one pixel at a time, such as a row of pixels or even all of the pixels of the backlight panel 116.

In a step 714 (OPERATE SELECTED LED COLOR AT SELECTED CALIBRATION POINT), the selected subpixel is switched on and driven, for example by the LED driver 422, at the selected calibration point, meaning at the defined average current setting.

In a step 716 (ADD CALIBRATION OFFSET=0 TO CALIBRATION POINT), an offset current, which may be positive or negative, is added to the average current defined by the selected calibration point. The offset current is in the form of a current value and/or a PWM setting to be added to the LED current setting values during normal operation. For example, the LED driver 422 generates the sub-pixel offset currents to be added to the average current. In an example, the LED driver 422 includes a circuit dedicated to the generation of the subpixel offset currents to be added to the average current. The LED driver 422 is configured, for example, to apply an offset current equal to zero in operation 716, as no offset has yet been determined by the calibration method.

In a step 718 (GET RGB-SENSE MD-PIXEL PHOTODIODE SIGNAL), the output current of the photodiode 210, associated with the selected subpixel, is determined. In some embodiments, this involves converting, for example, the output current of the photodiode 210 into a voltage signal, and converting the voltage signal into a digital signal using an analog to digital converter. Circuits for reading signals captured by photodiodes are known to those skilled in the art, and will not be described in more detail herein.

In a step 720 (IS DESIRED PHOTODIODE SIGNAL MATCHED WITHIN CALIBRATION TOLERANCE?), the output current of the photodiode determined at step 718 is compared to the target output current defined in step 710, while taking into account the target tolerance defined in step 708. The target output current and target tolerance together define, for example, a permissible output current range. If the determined output current falls within this output current range (branch Y), then a step 724 is for example performed. If the determined output current falls outside of this output current range (branch N), then a step 722 is, for example, performed.

In the step 722 (CHANGE CALIBRATION OFFSET), the calibration offset is increased or decreased according to the result of the comparison of step 720. In other words, the drive current applied to the LEDs of the subpixel is increased or decreased by increasing or decreasing the current offset added to the average current setting. In particular, if the measured photodiode signal is lower than the permissible output current range, the current offset is for example increased in operation 722, whereas if the measured photodiode signal is higher than the permissible output current range, the current offset is decreased, for example, in operation 722. Then the steps 718 and 720 are performed again. The adjustment of calibration offset of step 722 may be performed according to any algorithm. For example, in some embodiments, the offset current is increased or decreased by a fixed increment or decrement in operation 722, and an iterative process is applied in operations 718, 720 and 722 until the photodiode current converges to within the permissible output current range. Alternatively, the current offset is changed in step 722 by an amount determined as a function of a difference between the desired photodiode signal and the measured photodiode signal.

In the step 724 (STORE APPLIED OFFSET AND SI PD OUTPUT SIGNAL), the applied driving current offset, as well as, in some cases, the corresponding output current of the photodiode, are stored for example in the system memory 436. The photodiode output current is optionally stored for tracking and/or debugging purposes (e.g., to track the aging of the photodiode and consequently adjust the tolerance target).

In a step 726 (LAST RGB-SENSE MD-PIXEL?), if all the emitting pixels 202, 302 of the array have been processed by the calibration method (Y), a further step 728 is performed. If all the emitting pixels of the array have not yet been processed by the calibration method (N), the calibration method is repeated, starting from step 712, for the next pixel.

In the step 728 (LAST CALIBRATION POINT?), if all the calibration points have been processed by the calibration method (Y), a further step 730 is performed. If all the calibration points have not yet been processed by the calibration method (N), the calibration method is repeated, starting from step 706, for the next calibration point.

In the step 730 (LAST COLOR?), if all the colors have been processed by the calibration method (Y), the method ends, for example, at a step 732 (END PROCESS). In this case, for all light emitting pixels 202 in the backlight panel of a given color and for a given calibration point, luminance should be equal, within some tolerance. If all the colors have not yet been processed by the calibration method (N), the calibration method is repeated, for example starting from step 704, for the next color.

The aim of the method of FIG. 7 is to determine a calibration offset for each light-emitting pixel 202 of the array, and for each calibration point of each sub-pixel color.

This method is executed, for example, during a production factory test and can be re-performed during the operating lifetime of the electronic device 200, 400 (e.g., at display startup and/or during display blanking time).

Application of the method to all subpixels 106, 108, 110 in the array of light emitting pixels 202 may be either sequential with any order, or in parallel.

Such a method allows an active compensation of the color/white balance of the electronic device. Indeed, by performing the calibration in order to obtain a desired ratio between the luminance of each color of light emitted by the sub-pixels of each pixel, color or white balancing is achieved.

Figure 8:
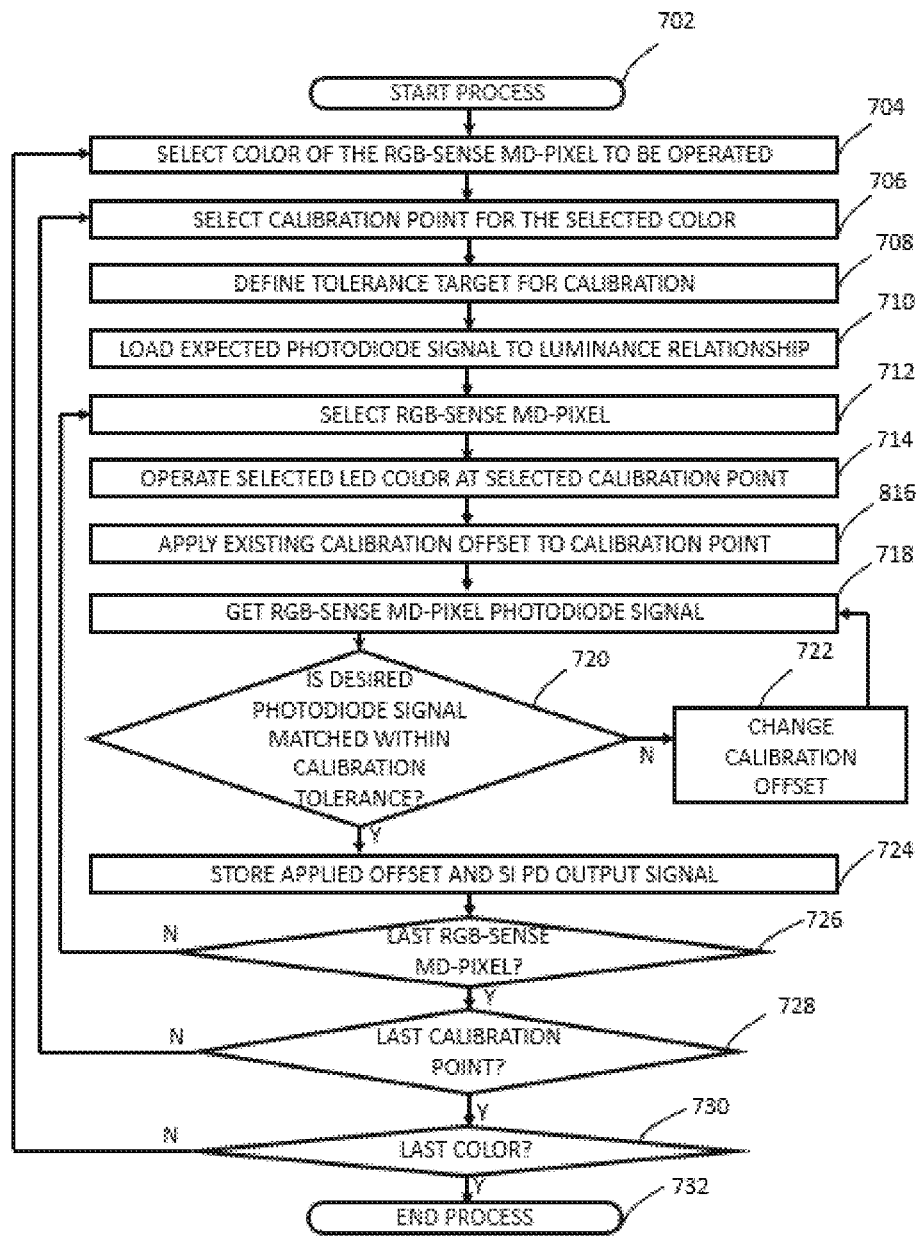
FIG. 8 is a flow diagram illustrating steps of a method of calibrating light emitting pixels of a backlight panel of FIG. 2 or FIG. 4.

FIG. 8 is a flow diagram illustrating steps of a method of calibrating light emitting pixels of a backlight panel of FIG. 2 or FIG. 4. The method of FIG. 8 is similar to the calibration method of FIG. 7, but rather than being performed at the factory, it is performed during the lifetime of the display in order to update previously programmed calibration offsets for each calibration point. For example, such a recalibration permits the offsets to the changed in order to take into account variations due to aging and/or the operating temperature.

The method of FIG. 8 involves similar steps to the method of FIG. 7, except that step 716 is replaced by a step 816 (APPLY EXISTING CALIBRATION OFFSET TO CALIBRATION POINT). In step 816, the existing calibration offset is applied to the driving current of the concerned subpixel.

Like the method of FIG. 7, after the method of FIG. 8 has been completed, the luminance of all light emitting pixels 202 in the backlight panel should be equal, within some tolerance, of a given color and for a given calibration point.

In an example, the control circuit 230 controls, for example, the respective level of light emission of the first, second and third subpixels to obtain a ratio between the detected amount of reflected light of the first, second and third subpixels that leads to a white color at the light emitting pixels level.

The example method of FIG. 8 can be executed, for example, after factory tests and during display operating lifetime (e.g., at electronic device startup and/or at electronic device shutdown and/or during display blanking time and/or after an activation command from display user). The existing calibration offsets are known before the method starts.

Such a method allows an active compensation of the color/white balance throughout the lifetime of the electronic device.

Figure 9:
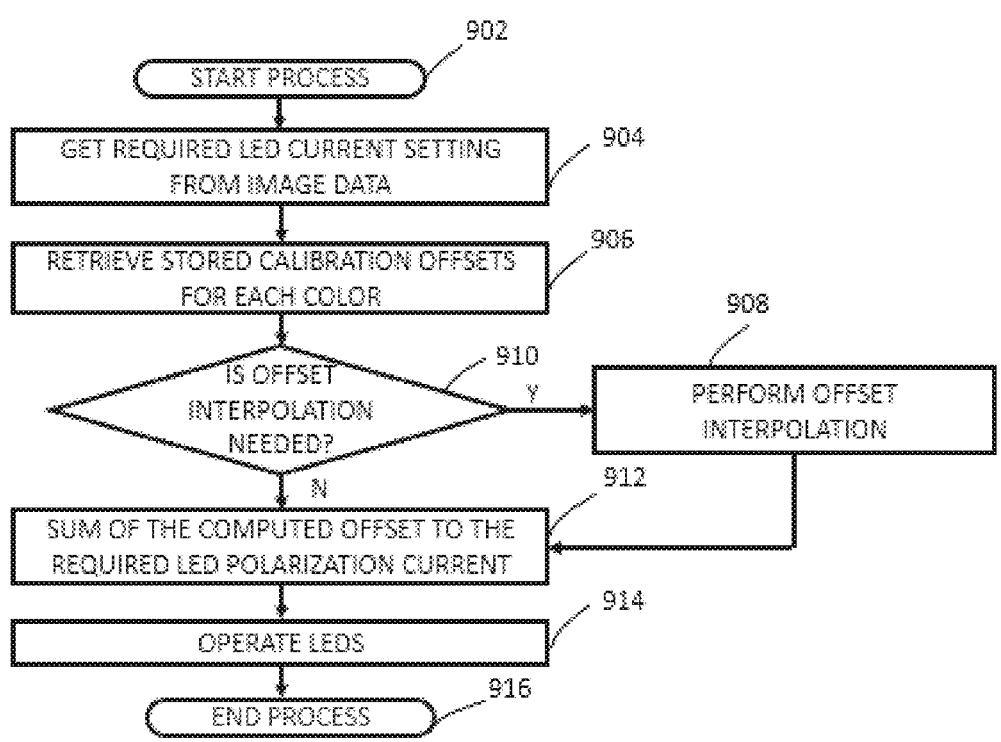
FIG. 9 is a flow diagram illustrating steps of a method of controlling the light emitting pixels of a backlight panel of FIG. 2 or FIG. 4 based on calibration results.

FIG. 9 is a flow diagram illustrating steps of a method of controlling the light emitting pixels of a backlight panel of FIG. 2 or FIG. 4 based on calibration results. The method of FIG. 9 is also an example of how step 722 can be implemented. The method of FIG. 9 illustrates the process of application of the calibration offsets to the required LED current setting of each light emitting pixel 202 in the backlight panel, based on the image data to be displayed. The method of FIG. 9 is performed, for example, in order to activate all pixels of the backlight panel at the same time, although in some embodiments determining the current setting of each sub-pixel may be performed sequentially.

In a step 902 (START PROCESS), the method begins.

In a step 904 (GET REQUIRED LED CURRENT SETTING FROM IMAGE DATA), the desired current setting for driving the LEDs of the subpixels 106, 108, 110 is determined from image data.

In a further step 906 (RETRIEVE STORED CALIBRATION OFFSETS FOR EACH COLOR), the stored calibration points, obtained for example by the method of FIG. 7, are retrieved.

In a further step 908 (IS OFFSET INTERPOLATION NEEDED?), if the desired subpixel LED current setting from image data is different from the available calibration points (branch Y), then a further step 910 (PERFORM OFFSET INTERPOLATION) is performed. If the desired subpixel LED current setting from image data is similar from the available calibration points (branch N) then a further step 912 (SUM OF THE COMPUTED OFFSET TO THE REQUIRED LED POLARIZATION CURRENT) is performed.

In the step 910, an interpolation with any algorithm, for example linear, of the offset calibration points at the desired LED current setting is performed, for example, to get the calibration offset to be applied.

In the step 912, the computed offset is summed (while considering that the offset can be positive or negative) to the subpixel LED polarization current and the resulting sum is applied in a further step 914 (OPERATE LEDS), for example, by the LED driver 422, to the subpixel LEDs.

In a further step 916 (END PROCESS), the method ends.

Figure 10:
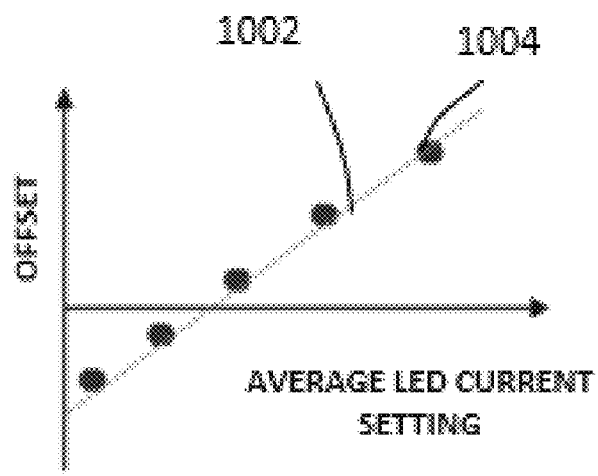
FIG. 10 is a graph of an offset of the calibration points as a function of a subpixel LED current setting and a linear interpolation of the calibration points.

FIG. 10 is a graph of the offset of the calibration points as a function of a subpixel LED current setting and a linear interpolation 1002 of the calibration points 1004. According to another example, other types of interpolation could be performed. The linear interpolation is made during the step 910 of FIG. 9. A set of calibration points similar to that of FIG. 10 is defined, for example, for each LED color. While FIG. 10 illustrates an example in which there are five calibration points associated with the given LED color, there could be a different number of calibration points, which may not be equal among the different LED colors.

Figure 11:
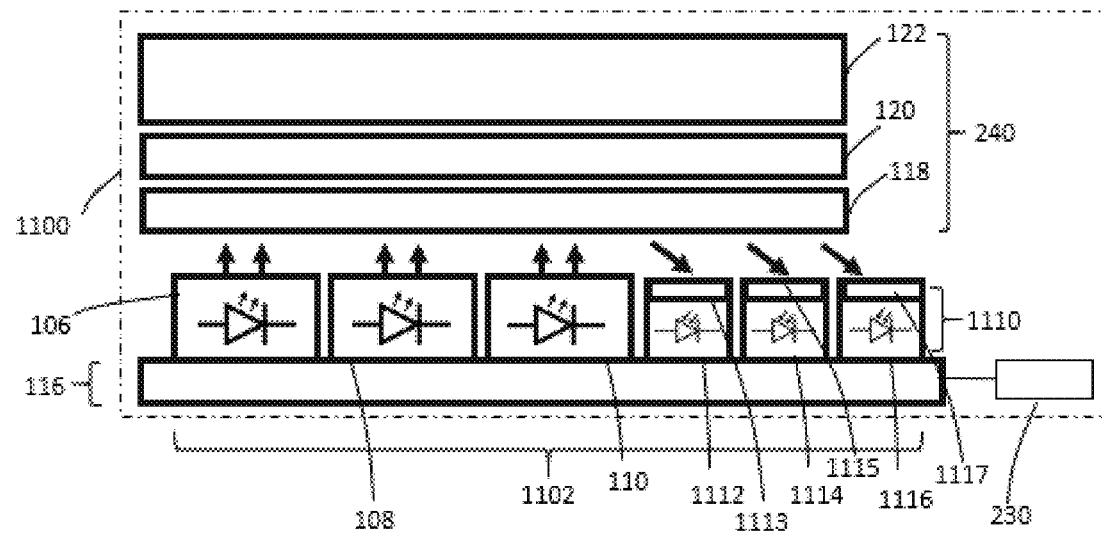
FIG. 11 is a schematic sectional view of an optoelectronic device.

FIG. 11 is a schematic sectional view of an electronic device 1100. The electronic device 1100 is, for example, similar to the device of FIG. 2, except that the photodetector 1110—or each of photodetectors of the plurality of detectors in the example where a plurality of photodetectors are arranged per light emitting pixel—comprises a plurality of photodiodes, for example, first, second and third photodiodes 1112, 1114, 1116. The photodetector 1110 comprises, for example, a first filter 1113 covering the first photodiode 1112 and arranged to at least partially filter out and at least partially prevent the second wavelength light from reaching the photodiode 1112 and/or the third wavelength light reaching the first photodiode 1112. For example, the first filter 1113 is arranged between the photodiode 1112 and the display 240. The photodetector 1110 comprises, for example, a second filter 1115 covering the second photodiode 1114 and arranged to at least partially filter out and at least partially prevent the first wavelength light from reaching the second photodiode 1114 and/or the third wavelength light from reaching the second photodiode 1114. For example, the second filter 1115 is arranged between the second photodiode 1114 and the display 240. The photodetector 1110 comprises, for example, a third filter 1117 covering the third photodiode 1116 and arranged to at least partially filter out and at least partially prevent the first wavelength light from reaching the third photodiode 1116 and/or the second wavelength light from reaching the third photodiode 1116. For example, the third filter 1117 is arranged between the third photodiode 1117 and the display 240.

The control circuit 230 controls, for example, the level of light emission of the first subpixels 106 as a function of the amount of reflected light detected respectively by the first photodiode 1112. In another example, the control circuit 230 controls, for example, the level of light emission of the second subpixels 108 as a function of the amount of reflected light detected respectively by the second photodiode 1114. The control circuit 230 controls, for example, the level of light emission of the third subpixels 110 as a function of the amount of reflected light detected respectively by the third photodiode 1116.

In another example, the control circuit 230 controls, for example, the respective level of light emission of the first and/or second and/or third subpixels 106, 108, 110 as function of a ratio of the respective amount of reflected light detected by the first and/or the second and/or the third photodiodes 1112, 1114, 1116. In an example, this ratio is set to obtain a combined color at the pixel level which is, for example, white.

An advantage of the described electronic device of FIG. 2 or FIG. 4 or FIG. 11 and methods of FIGS. 7 to 9 is the luminosity and/or the white balance of the backlight panel can be calibrated pixel by pixel in a relatively inexpensive and simple manner. Furthermore, in some embodiments, the use of the photodiodes for calibrating the luminosity of different colored LEDs in each pixel permits a reduction in cost and complexity of the backlight panel because the color conversion portion 118 in the stack of the display can be omitted. Another advantage is the improvement of white color balance or image color quality and display lighting uniformity overtime to counter act effects of aging. Another further advantage is that system complexity and system cost are reduced by faster and cheaper backlight calibration in the factory. An additional advantage is that it is possible to perform an active subpixel LED brightness and color adjustment in order to adjust subpixel LED driving current against LED droop with temperature, and compensate for example for temperature differences due to edge effects. An additional advantage is that an active brightness and color adjustment is possible by adjusting the LEDs current driving of each subpixel individually, as each color LED ages overtime, as a function of their actual emission level.

Various embodiments and variants of the first aspect have been described. Those skilled in the art will understand that certain features of these embodiments can be combined and other variants will readily occur to those skilled in the art.

Finally, the practical implementation of the embodiments and variants of the first aspect described herein for the first aspect is within the capabilities of those skilled in the art based on the functional description provided hereinabove. In particular, the calibration methods of FIG. 7 or FIG. 8 may be achieved by the LED driver 422 and/or a different circuitry. In another case, the integration of photodiode sensing circuitry is implemented inside the LED driver 422.

Second Aspect

Beside the need addressed by the first aspect, there is a further need to reduce the impact of external light from the outside of the display on the perception of the displayed pictures. Moreover, even if sensing elements may exist in the art to sense external light brightness, they are often placed outside the display which leads to a large space occupancy. The related additional system architecture increases complexity and increases costs. Brightness adjustment implemented in the state of the art may additionally not be enough accurate and localized for improving the quality of displayed images with respect to the perception by the human eye.

Example embodiments of an optoelectronic device and of a method of driving an optoelectronic device will now be described with reference to FIGS. 12 to 16.

Figure 12:
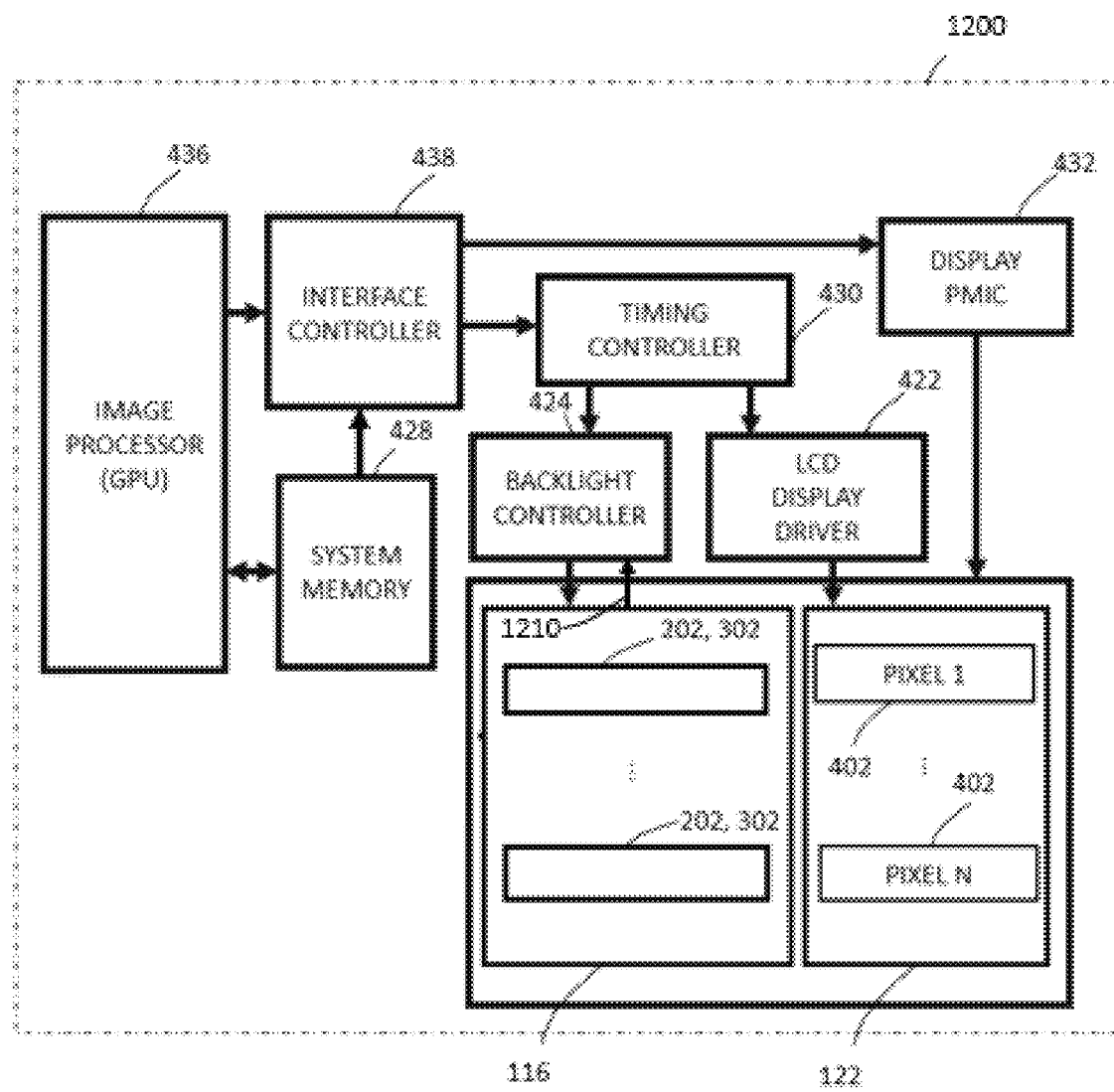
FIG. 12 schematically illustrates an architecture of an optoelectronic device.

FIG. 12 schematically illustrates an architecture of an optoelectronic device 1200.

The architecture of the optoelectronic device 1200 is similar to the architecture of the device 400 of FIG. 4 except that the optoelectronic device 1200 is related to a backlight 116 having subpixels similar to the subpixels of FIG. 1, i.e., without the additional photodetector 210. In the architecture of FIG. 12, there are no calibration data generated by an additional photodetector contrary to the example of FIG. 4.

In an example, the pixels of the backlight 116 have first, second and third subpixels and for example one or more further subpixels. In an example, one or more diodes of the first subpixels are configured to emit light of a first wavelength and detect wavelengths smaller than the first wavelength. In another example, the diodes of the second subpixel are configured to emit light of a second wavelength, different to the first wavelength, and detect wavelengths smaller than the first wavelength. In another example, the diodes of the third subpixel are configured to emit light of a third wavelength different to the first and second wavelengths and detect wavelengths smaller than the third wavelength. In a further example where the pixels comprise one or more further subpixels, one or more diodes of each of the further subpixels are configured to emit light of a fourth wavelength different to each other subpixel of the pixels and detect wavelengths smaller than the fourth wavelength. In an example, the first wavelength is equal to at least 400 nm and less than 490 nm, the second wavelength is equal to at least 500 nm and less than 570 nm, the third wavelength is equal to at least 600 nm and less than 660 nm and the fourth wavelength is equal to at least 800 nm and less than 900 nm.

According to an example, the diodes of the subpixels are individually covered with a color conversion element configured to convert light emitted by the diodes into light of a different wavelength from the wavelength of the light emitted by these diodes.

In the represented example, the diodes of the various subpixels are configured, in a non-emitting mode, to detect external light illuminating the display panel, and in an emitting mode, to emit light.

External light can be defined as the light coming from the outside of the device 1200 and falling onto the display area. External light passes through the display 122 and is detected by the diodes, i.e. the photodiodes, of the subpixels 106, 108, 110 of the backlight, which are usually only used for emission.

The non-emitting mode can be defined as a mode wherein the diodes of the subpixels of the backlight 116 are not emitting. For example, the non-emitting mode is performed between two emitting modes wherein light is emitted by the diodes. A frequency superior to 50 Hz can be programmed, for example, by the person of the art for switching between these two modes. In an example, diodes of a first type, i.e., diodes emitting one given color, are switched between the emitting and non-emitting modes while the color diodes are kept in one of the two modes. In another example, all types of diodes are switched at the same time from one mode to the other. The emitting and non-emitting modes of each sub-pixel are multiplexed, for example, over time.

In the represented example, a link 1210, for example a bus, provides the respective detected external light signals coming from each of the subpixels towards a computing unit. In the represented example, the computing unit is configured to generate and provide external light data based on an amount of light detected by each of the different type of diodes. In other words, the computing unit acquires and provides external light data separately from each color subpixels.

The computing unit is, for example, comprised in the backlight controller 424, which may also act as a control unit. In an example, the computing unit is the backlight controller 424.

In the represented example, the computing unit is comprised in the backlight controller 424, and is configured to receive picture data, otherwise said frame data, for example from the timing controller 430. In this example, the backlight controller 424 is further configured to apply driving signals to the diodes of the dedicated subpixels, based on their respective external light data and based on the picture data received as input. The picture data are, for example, in a form of a table of target color and/or brightness to be displayed by each subpixel or pixel of the backlight.

In the represented example, the backlight controller 424 acts as a control unit configured to provide driving signals to drive the diodes of the dedicated subpixels. The backlight controller 424 adjusts, for example, the driving signals of the diodes of the subpixels to modify the amplitude and/or the pulse width based on external light data detected in the non-emitting mode.

According to an example, in the non-emitting mode, the backlight controller is configured to drive the diodes of the subpixels with a null or inverse bias/current. In another example, in the emitting mode, the backlight controller is configured to drive the diodes of the subpixels with a forward bias/current. When receiving picture data, the backlight driver 424 applies driving signals, to the diodes, based on their respective computed external light data and based on the picture data. Picture data are thus modulated, otherwise said reshaped, by the backlight driver 424 based on the detected external light for example for each subpixel color.

The computation of the acquired external light data involves, for example, the use of suitable algorithms, and the selection of such algorithms will be within the capabilities of a person skilled in the art.

An advantage of the device of FIG. 12 is that the external light detection circuitry is integrated inside the backlight driver 424 and the same diodes are used for both emission and as external light detectors.

Figure 13:
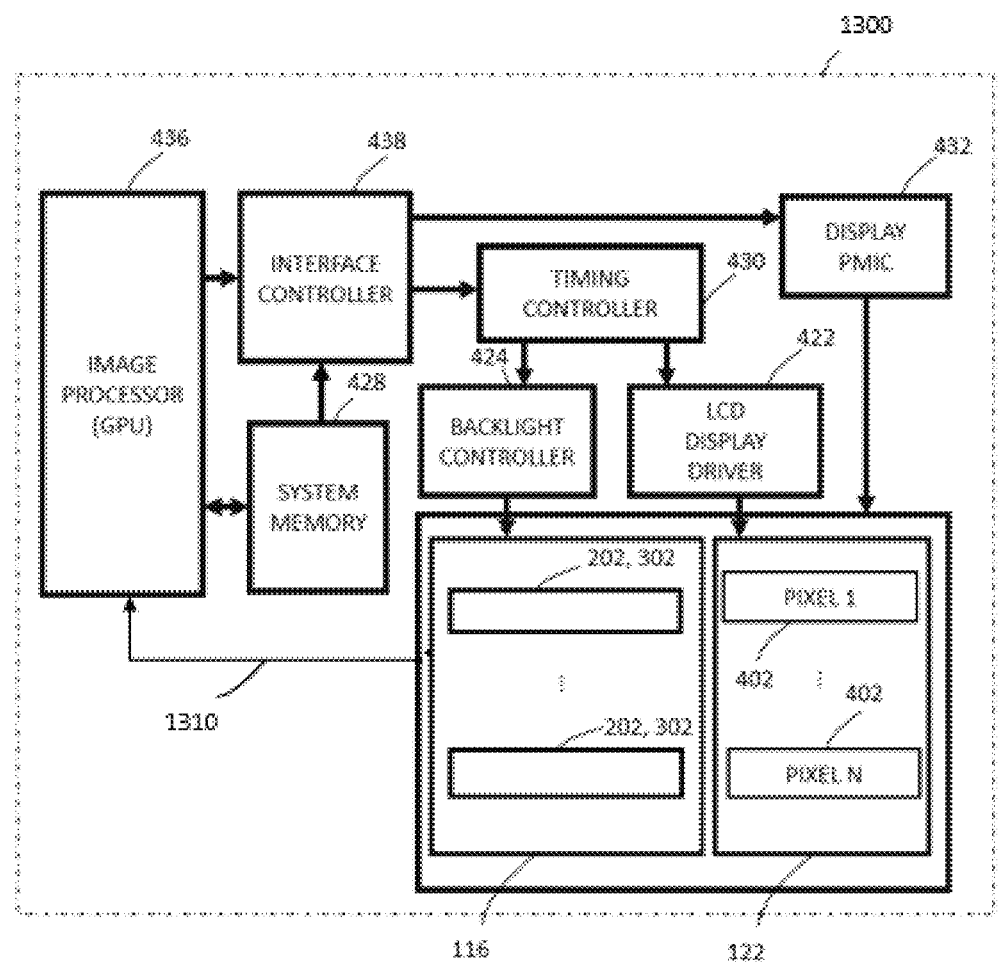
FIG. 13 schematically illustrates an architecture of an optoelectronic device.

FIG. 13 schematically illustrates an architecture of an optoelectronic device 1300.

The optoelectronic device 1300 is similar to the optoelectronic device 1200 of FIG. 12, except that the computing unit is comprised in the image processing unit 436 of the optoelectronic device. A link, for example a bus 1310, is configured to bring detected external light data to the image processing unit 436. In this case, the backlight controller 424 still acts as the control unit.

In the example of FIG. 13, the processing unit 436 is configured to modify picture data based on the computed external light data and send the data toward the timing controller 430. The control unit, i.e., the backlight controller 424, is configured to receive the modified picture data and apply driving signals to the diodes of the subpixels, corresponding to the modified picture data.

Figure 14:
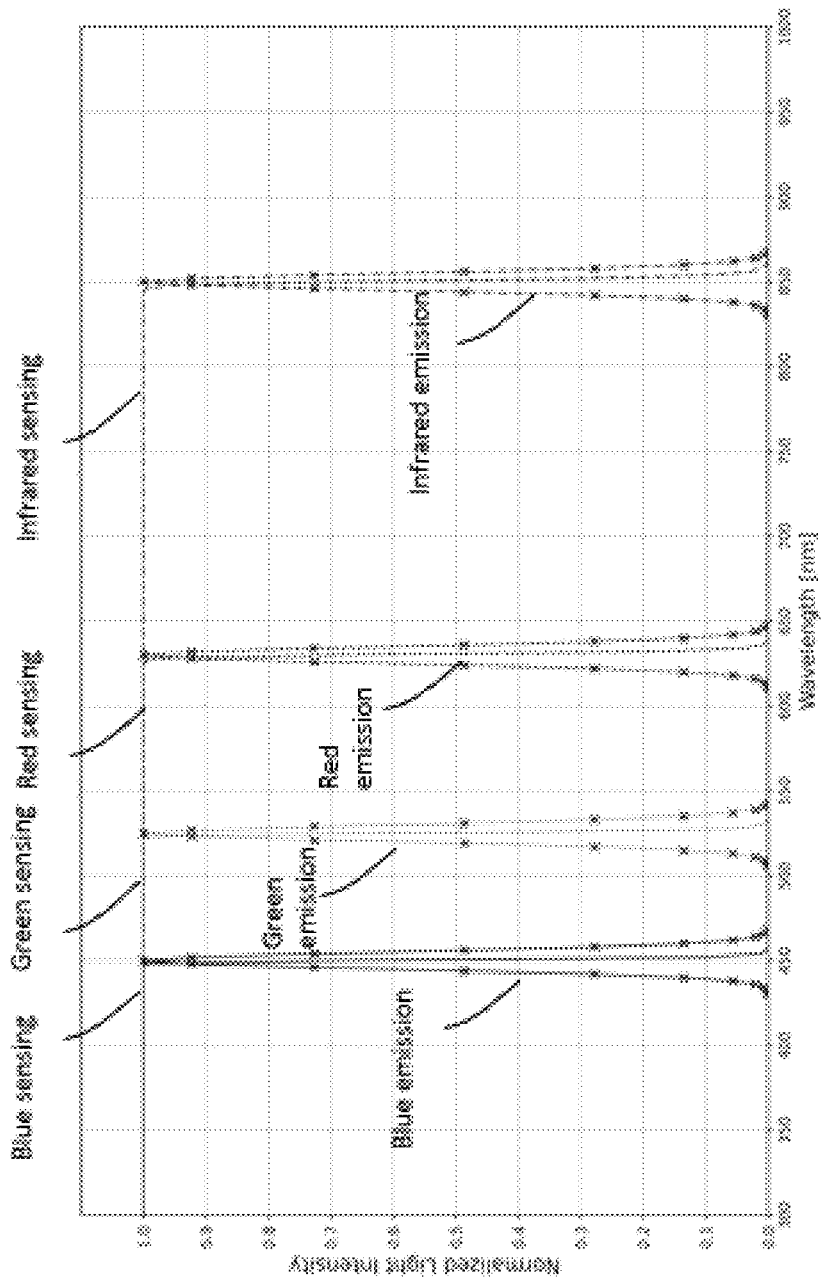
FIG. 14 illustrates example measurements of light absorption and light intensity as a function of wavelength.

FIG. 14 illustrates example measurements of light absorption and light intensity as a function of wavelength. More particularly, the FIG. 14 illustrates normalized intensities of the emission of blue, green red and infrared diodes of the backlight as well as their respective absorption.

Blue emission (Blue emission) extends between 430 nm and less than 475 nm and is centered on 450 nm, green emission (Green emission) extends between 500 nm and less than 550 nm and is centered on 525 nm, red emission (Red emission) spreads between 600 nm and less than 650 nm and is centered on 625 nm, and infrared emission (Infrared emission) extends between 830 nm and less than 870 nm and is centered on 850 nm approximatively.

In the represented example, wavelengths of light absorbed, i.e., detected, by the blue diodes, are lower than 460 nm (Blue sensing), wavelengths of light detected by the green diodes (Green sensing) are lower than 530 nm, wavelengths of light detected by the red diodes (Red sensing) are lower than 640 nm and wavelengths of light detected by the infrared diodes (Infrared sensing) are lower than 860 nm approximatively.

A person skilled in the art will understand how the detection ability, i.e., the absorption levels and wavelengths of each type (color), of subpixel diodes could be combined in order to elaborate the algorithms used to reshape the picture data.

Figure 15:
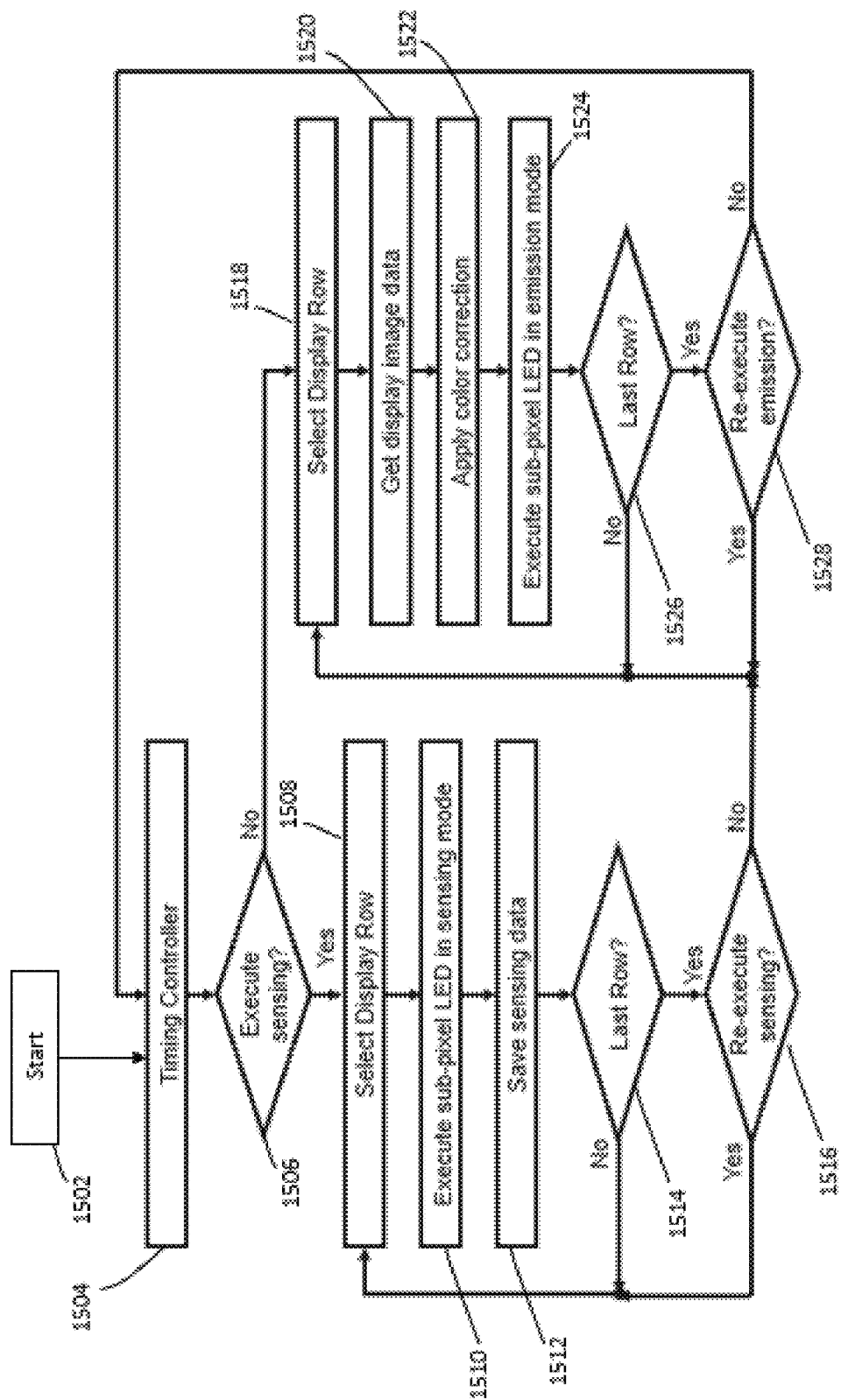
FIG. 15 is a flow diagram illustrating steps of driving the optoelectronic device of FIG. 12 or 13.

FIG. 15 is a flow diagram illustrating an example of steps of driving the optoelectronic device 1200, 1300 of FIG. 12 or 13. More particularly, the represented example relates on a frame by frame, otherwise said picture by picture, adjustment of the frame pixel colors and/or brightness based on detected external light.

In a first step 1502 (Start), the driving method begins.

In a further step 1504 (Timing Controller), picture or frame data are supplied by the timing controller 430 to the backlight controller 424.

In a further step 1506 (Execute sensing?), the backlight controller 424 enables external light detection ("Yes" branch), for example by switching to the non-emitting mode, or disables external light detection ("No" branch), for example by switching to the emitting mode.

In the "Yes" case, a further step 1508 (Select Display Row) is enabled by selecting a row of pixels of the backlight 116.

In the "No" case, a further step 1518 (Select Display Row) is executed.

In a further step 1510 (Execute sub-pixel LED in sensing mode), the non-emitting mode is enabled and the diodes of the subpixels of the pixels of the selected row are controlled with a null or inverse bias/current.

In a further step 1512 (Save sensing data), the external light data are stored in a memory, for example a non-volatile memory or a volatile memory.

In a further step 1514 (Last Row?), if the selected pixel row is the last of the backlight 116 then a branch "Yes" is followed, otherwise a branch "No" is followed.

In the case of the branch "No", then steps 1508, 1510, 1512 and 1514 are executed.

In the case of the branch "Yes", then a further step 1516 (Re-execute sensing?) is configured to execute again or not the external data detection. In case the non-emitting mode has to be executed once again (branch "Yes") then steps 1508, 1510, 1512 and 1514 are executed again. In case the non-emitting mode is not necessary anymore (branch "No"), then step 1518 is executed.

During step 1518, a row of pixels of the backlight is selected.

In a further step 1520 (Get display image data), the data of the selected row of the picture to be displayed are retrieved.

In a further step 1522 (Apply color correction), the selected row data are adjusted, otherwise said reshaped, by the backlight controller 424 or the image processor 436, based on the corresponding external light data, which have been detected by the diodes of the same row and saved in steps 1508 to 1512.

In a further step 1524 (Execute sub-pixel LED in emission mode), the emitting mode is enabled and the backlight driver 424 is configured to send driving signals to the diodes of the selected row of pixels corresponding to the reshaped picture data.

In a further step 1526 (Last Row?), if the selected row is the last row of the picture, then a "No" branch is followed and the steps 1518 to 1524 are executed again. On the contrary, a "Yes" branch is followed toward a further step 1528 (Re-execute emission?).

In the step 1528, if the emitting mode is to be executed once again, then a "Yes" branch is followed and steps 1518 to 1524 are executed again. In the contrary case, a "No" branch is followed and step 1504 is executed but for a further picture or frame.

In an example, external light detection with the non-emitting mode may be performed between two complete cycles of picture displaying in emitting mode.

In another example, the row scanning order between the steps 1506 to 1514 and between the steps 1518 to 1526, i.e., between external light detection and light emission, may be different.

Figure 16:
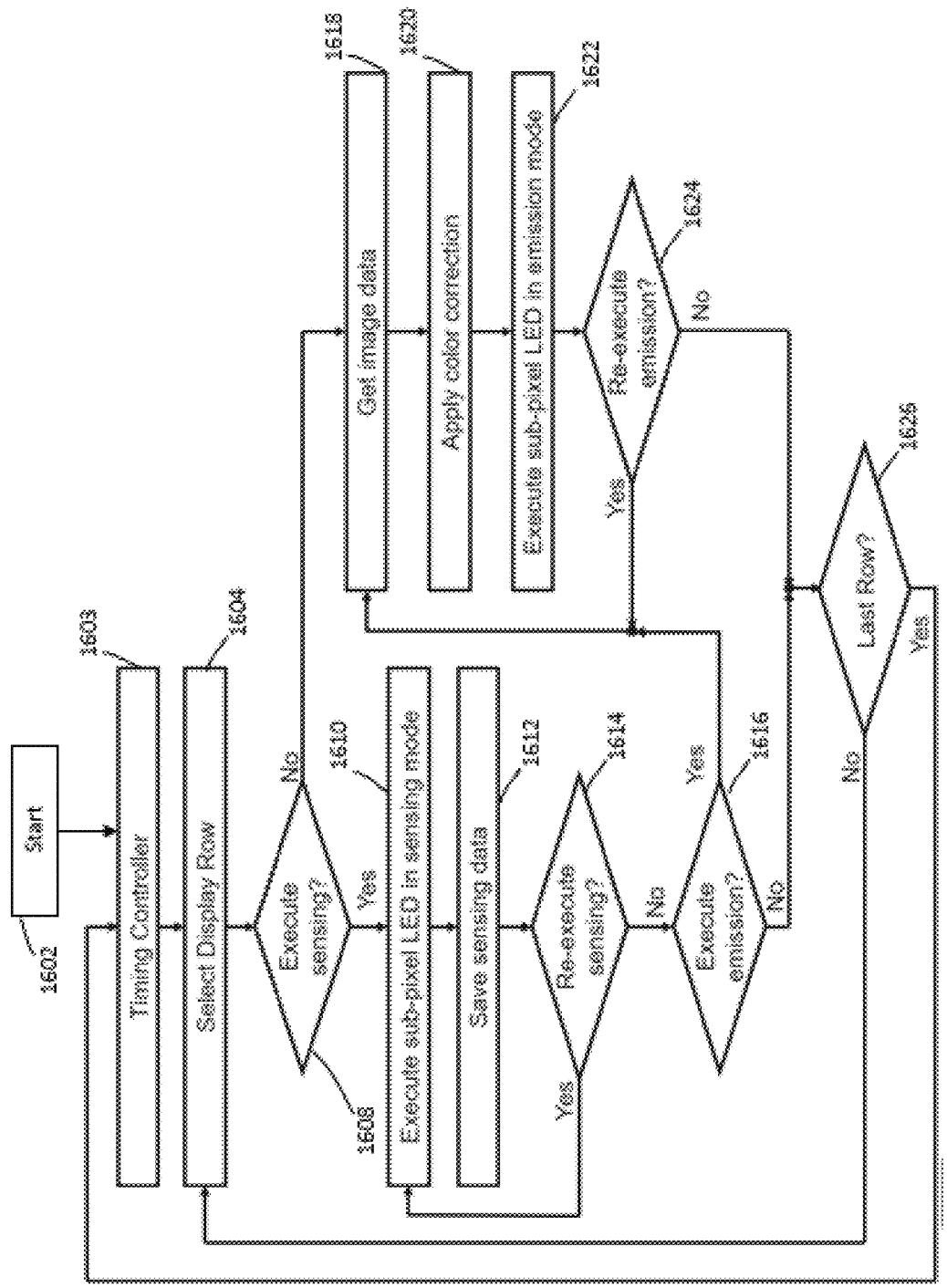
FIG. 16 is a flow diagram illustrating steps of driving the optoelectronic device of FIG. 12 or 13.

FIG. 16 is a flow diagram illustrating an example of steps for driving the optoelectronic device 1200, 1300 of FIG. 12 or 13. More particularly, the represented example relates on a frame, otherwise said a picture, internal adjustment of the pixel colors and/brightness based on external light detected.

In a first step 1602 (Start), the driving method begins.

In a further step 1603 (Timing Controller), picture data, otherwise said frame data, are supplied by the timing controller 430 to the backlight controller 424.

In a further step 1604 (Select Display Row), the backlight controller 424 selects a row of the picture to be displayed.

In a further step 1608 (Execute sensing?), the backlight controller 424 enables external light detection ("Yes" branch) or disable external light detection ("No" branch).

In the "No" case, a further step 1618 (Get image data) is executed.

In the case of the "Yes" branch, a further step 1610 (Execute subpixel LED in sensing mode) is executed. In this step 1610, the non-emitting mode is enabled for the diodes of the pixels row that has been selected.

In a further step 1612 (Save sensing data), the detected external light data, as detected by the pixels row diodes, are stored for example similarly as in step 1512.

In a further step 1614 (Re-execute sensing?), the backlight controller is configured to choose to execute again external data detection or to stop it. In case the non-emitting mode is to be executed once again (branch "Yes") then steps 1610 and 1612 are executed again. In case the non-emitting mode is not necessary anymore (branch "No"), then a further step 1616 (Execute emission?) is executed.

In the step 1616, the backlight controller 424 starts the emitting mode ("Yes" branch toward step 1618) or ("No branch) a further step 1626 (Last Row?) is executed.

In the step 1618, the data corresponding to the selected image pixel row are retrieved.

In a further step 1620 (Apply color correction), the selected row data are adjusted, otherwise said reshaped, by the backlight controller 424 or the image processor 436, based on the corresponding external light data, which have been detected by the diodes of the same row and saved in steps 1608 to 1616.

In a further step 1622 (Execute sub-pixel LED in emission mode), the emitting mode is enabled and the backlight driver 424 is configured to send driving signals to the diodes of the selected row of pixels, corresponding to the reshaped picture data.

In a further step 1624 (Re-execute emission?), if the emitting mode is to be executed once again, then a "Yes" branch is followed and steps 1618 to 1624 are executed again. In the contrary case, a "No" branch is followed toward step 1626.

In step 1626, if the selected row is the last of the pictures to be displayed then a "Yes" branch is followed to execute step 1603 again or to stop the driving method. If the selected row is not the last row of the image then step 1604 is executed again.

In an example, external light detection with the non-emitting mode may precede the emiiting mode inside the same frame and display rows.

In another example, the row scanning order between external light detection and emission may be different.

An advantage of the driving method of FIGS. 15 and 16 is that a local pixel color adjustment is rendered possible.

Various embodiments and variants of this second aspect have been described. Those skilled in the art will understand that certain features of these embodiments can be combined and other variants will readily occur to those skilled in the art. In particular, the architecture of FIGS. 4 and 12 or FIG. 13 could be merged by using the pixels of FIG. 2 to provide both an adjustment of color brightness as regards aging and an adjustment of color and brightness based on external light.

In an example, the optoelectronic devices 1200, 1300 comprise an analyzing unit configured to determine a human gesture from the detected external light data as detected by single detection or according to different successive detections.

Finally, the practical implementation of the embodiments and variants described herein for the second aspect is within the capabilities of those skilled in the art based on the functional description provided hereinabove. In particular, in the example of FIG. 15 or FIG. 16, instead of a selection of different rows, it is possible to envisage column by column or even pixel by pixel selection.

The invention claimed is:

1. A method of controlling a backlight panel of an optoelectronic device, comprising:
applying a first driving signal, by a control circuit of the backlight panel, to activate one or more light emitting diodes of a subpixel of a first light emitting pixel of the backlight panel;
wherein each first light emitting pixel comprises said subpixel and at least one photodetector;
detecting, by the at least one photodetector, an amount of reflected light emitted by said subpixel;
wherein the backlight panel comprises an array of light emitting pixels for illuminating a display panel of the optoelectronic device;
generating, by the control circuit, the first driving signal based on a first offset value corresponding to a first calibration point associated with said subpixel;
applying a second driving signal, by the control circuit, to activate said one or more light emitting diodes of said subpixel of said first light emitting pixel of the backlight panel;
generating, by the control circuit, the second driving signal based on a second offset value corresponding to a second calibration point, associated with said subpixel, and different from the first calibration point;

comparing the detected amount of reflected light with a respective calibration point associated to said at least one subpixel, within a tolerance range; and adjusting the level of light emission of said subpixel as function of the comparison by supplying the second driving signal to said subpixel.

2. The method according to claim 1, wherein different calibration points relative to said subpixel are stored in a look-up table, the look-up table comprising first and second driving signals and the respective targeted subpixels luminance as well as the photodetector output signal as function of its luminance input;

the detected amount of reflected light being respectively compared with an extrapolation between two different calibration points.

3. The method according to claim 2, wherein the control circuit operates to:

control the level of light emission of each first subpixel of the light emitting pixels of the backlight panel so that the detected amount of reflected light of each first subpixel is equal or approximatively equal for all light emitting pixels of the backlight panel; and control the level of light emission of each second subpixel of the light emitting pixels of the backlight panel so that the detected amount of reflected light of each second subpixel of the light emitting pixels of the backlight panel is equal or approximatively equal for all light emitting pixels of the backlight panel; and control the level of light emission of each third subpixel of the light emitting pixels of the backlight panel so that the detected amount of reflected light of each third subpixel is equal or approximatively equal for all light emitting pixels of the backlight panel.

4. The method according to claim 3, wherein the control circuit is configured to control the respective level of light emission of said first, second and third subpixels to obtain a ratio between the detected amount of reflected light related to the first, second and third subpixels that leads to a white color at the light emitting pixels level.

5. The method according to claim 1, further comprising:

detecting, by the photodetector of the first light emitting pixel, an amount of reflected light emitted by said at least one subpixel and reflected by the display panel, said at least one subpixel and the corresponding photodetector being coupled to the control circuit; and controlling, by the control circuit, a level of light emission of said at least one subpixel as a function of the detected amount of reflected light.

* * * * *